United States Patent
Yang (10) Patent No.: US 9,396,801 B1
(45) Date of Patent: Jul. 19, 2016

(54) MEMORY, AND ERASING METHOD, PROGRAMMING METHOD AND READING METHOD THEREOF

(71) Applicant: Shanghai Huahong Grace Semiconductor Manufacturing Corporation, Shanghai (CN)

(72) Inventor: Guangjun Yang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/968,152

(22) Filed: Dec. 14, 2015

(30) Foreign Application Priority Data

Dec. 30, 2014 (CN) .......................... 2014 1 0854986

(51) Int. Cl.
*G11C 16/12* (2006.01)
*H01L 27/115* (2006.01)
*G11C 16/14* (2006.01)
*G11C 16/26* (2006.01)

(52) U.S. Cl.
CPC ................ *G11C 16/12* (2013.01); *G11C 16/14* (2013.01); *G11C 16/26* (2013.01); *H01L 27/11536* (2013.01); *H01L 27/11541* (2013.01)

(58) Field of Classification Search
CPC ........ G11C 16/12; G11C 16/14; G11C 16/26; H01L 27/11536; H01L 27/11541
See application file for complete search history.

(56) References Cited

U.S. PATENT DOCUMENTS 8,942,044 B2 * 1/2015 Yang .................... 365/185.18
9,082,486 B2 * 7/2015 Yang .................... G11C 8/08

* cited by examiner

*Primary Examiner* — Harry W Byrne
*Assistant Examiner* — Lance Reidlinger
(74) *Attorney, Agent, or Firm* — Harness, Dickey & Pierce, P.L.C.

(57) ABSTRACT

Memory, and erasing, programming and reading method thereof are provided. In the memory, a first isolation cell, a second isolation cell and a memory cell have same structure. A first doped region of the memory cell and a second doped region of the first isolation cell are connected with a first bit line, a second doped region of the memory cell and a first doped region of the second isolation cell are connected with a second bit line. A first doped region of the first isolation cell serves as a connection terminal thereof, first and second control gate structures of the first isolation cell are connected together to serve as a control terminal thereof, a second doped region of the second isolation cell serves as a connection terminal thereof, first and second control gate structures of the second isolation cell are connected together to serve as a control terminal thereof.

10 Claims, 5 Drawing Sheets

MEMORY, AND ERASING METHOD, PROGRAMMING METHOD AND READING METHOD THEREOF

CROSS-REFERENCE TO RELATED APPLICATIONS

The present application claims priority to Chinese patent application No. 201410854986.9, filed on Dec. 30, 2014, and entitled "MEMORY, AND ERASING METHOD, PROGRAMMING METHOD AND READING METHOD THEREOF", and the entire disclosures of which is incorporated herein by reference.

TECHNICAL FIELD

The present disclosure generally relates to semiconductor field, and more particularly, to a memory, and an erasing method, a programming method and a reading method thereof.

BACKGROUND

Figure 1:
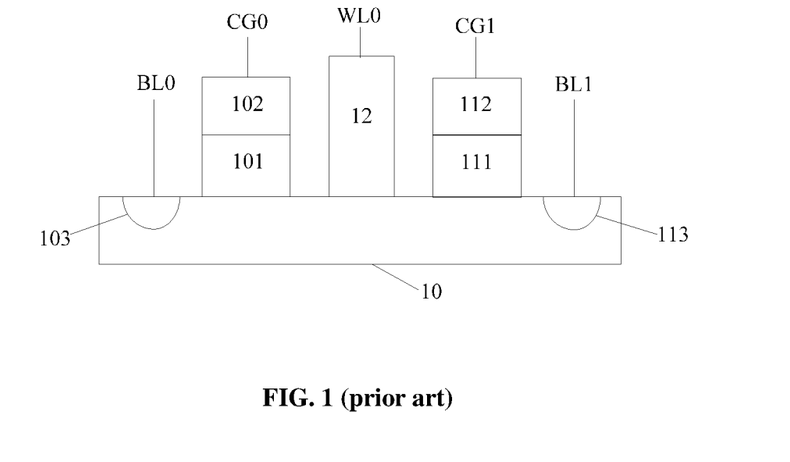
FIG. 1 schematically illustrates a structural diagram of a memory cell in existing techniques.

FIG. 1 schematically illustrates a structural diagram of a memory cell in existing techniques. Referring to FIG. 1, the memory cell includes a substrate 10, a first control gate structure 102, a second control gate structure 112, a first floating gate structure 101, a second floating gate structure 111 and a word line structure 12 that are disposed on the substrate 10, and a first doped region 103 and a second doped region 113 disposed in the substrate 10.

The first floating gate structure 101 is disposed on the substrate 10 between the first doped region 103 and the word line structure 12, and the second floating gate structure 111 is disposed on the substrate 10 between the second doped region 113 and the word line structure 12. The first control gate structure 102 is disposed over the first floating gate structure 101, and the second control gate structure 112 is disposed over the second floating gate structure 111.

Figure 2:
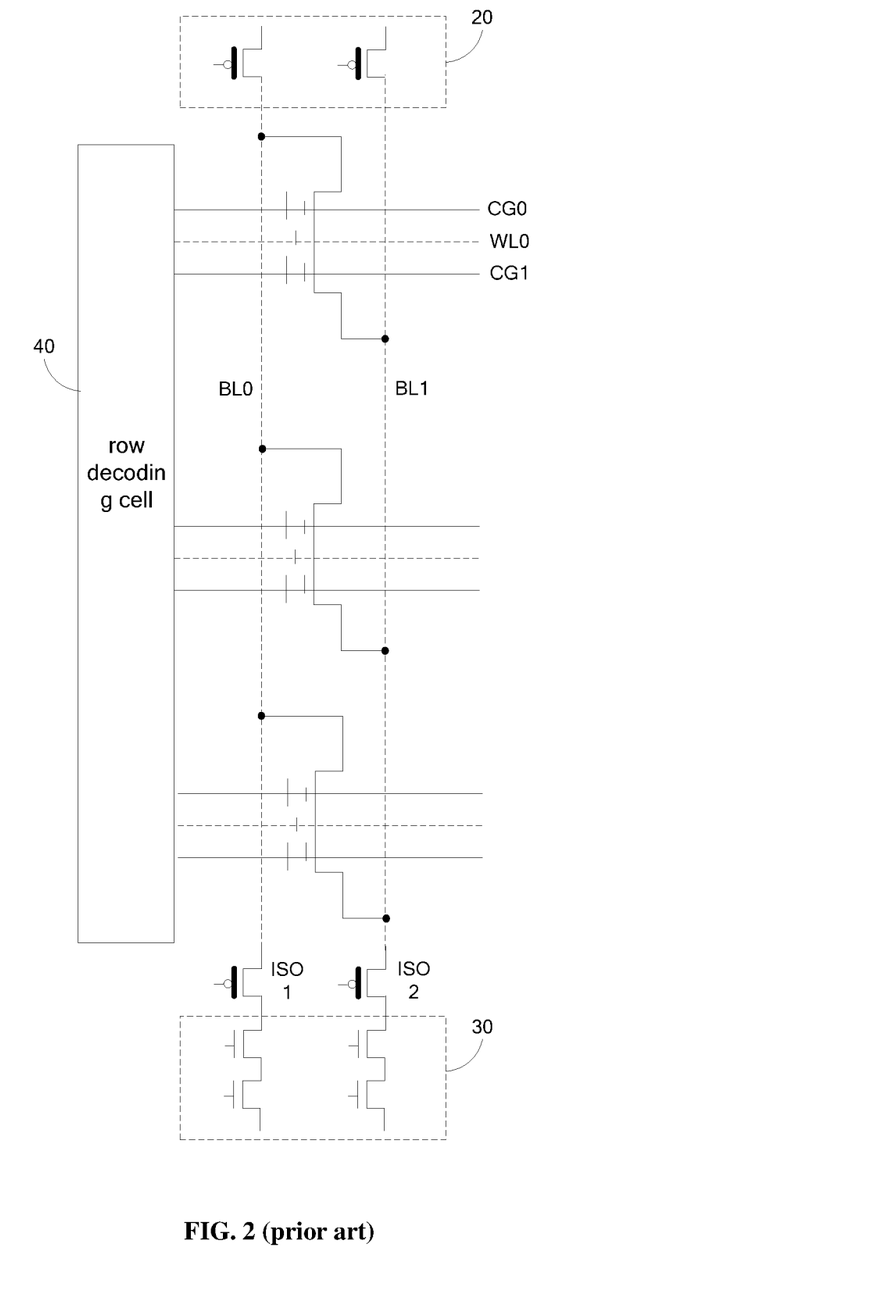
FIG. 2 schematically illustrates a circuit diagram of a memory in existing techniques.

FIG. 2 schematically illustrates a circuit diagram of a memory which consists of a plurality of memory cells shown in FIG. 1. In the memory, one column of memory cell includes three memory cells, which is taken for example to describe a connection structure of the memory.

Memory cells in a same column are connected with two bit lines, where first doped regions of the memory cells in the same column are connected with a first bit line BL0, and the second doped regions of the memory cells in the same column are connected with a second bit line BL1. One end of the first bit line BL0 is connected with a pull-up cell 20, the other end of the first bit line BL0 is connected with a first end of a first isolation transistor ISO1, and a second end of the first isolation transistor ISO1 is connected with a column decoding cell 30. One end of the second bit line BL1 is connected with the pull-up cell 20, the other end of the second bit line BL1 is connected with a first end of a second isolation transistor ISO2, and a second end of the second isolation transistor ISO2 is connected with the column decoding cell 30.

Hereinafter, an erasing operation to the memory cells, and programming and reading operations of the first floating gate structure 101 are taken for examples to describe operation voltages in detail.

When the erasing operation is performed, a row decoding cell 40 applies voltage of 7V to 9V to the word line structure 12 which is connected with a word line WL0, applies voltage of −9V to −7V to the first control gate structure 102 which is connected with a first control line CG0, and applies voltage of −9V to −7V to the second control gate structure 112 which is connected with a second control line CG1. The pull-up cell 20 applies voltage of 0V to the first bit line BL0, and applies voltage of 0V to the second bit line BL1.

When the programming operation is performed, the row decoding cell 40 applies voltage of 1.3V to 1.6V to the word line structure 12 which is connected with the word line WL0, applies voltage of 7V to 9V to the first control gate structure 102 which is connected with the first control line CG0, and applies voltage of 4V to 6V to the second control gate structure 112 which is connected with the second control line CG1. The pull-up cell 20 applies programming current to the first bit line BL0, and applies voltage of 5V to 6V to the second bit line BL1.

When the reading operation is performed, the row decoding cell 40 applies voltage of 2V to 5V to the word line structure 12 which is connected with the word line WL0, applies voltage of 0V to the first control gate structure 102 which is connected with the first control line CG0, and applies voltage of 2.5V to 5V to the second control gate structure 112 which is connected with the second control line CG1. The pull-up cell 20 applies voltage of 0V to the first bit line BL0, and applies voltage of 0.4V to 0.8V to the second bit line BL1.

In the above memory, the first isolation transistor ISO1 and the second isolation transistor ISO2 having an isolation function are generally high voltage transistors, which may make the memory circuit have a relatively great size.

SUMMARY

In embodiments of the present disclosure, size of a memory may be decreased.

In an embodiment, a memory is provided, including: a first bit line, a second bit line, and a memory cell, an isolation cell and a second isolation cell which are disposed in a same column, wherein the first isolation cell, the second isolation cell and the memory cell have a same structure, wherein the first isolation cell includes: a substrate, a first control gate structure, a second control gate structure, a first floating gate structure, a second floating gate structure and a word line structure that are disposed on the substrate, and a first doped region and a second doped region disposed in the substrate, wherein the first floating gate structure is disposed on the substrate between the first doped region and the word line structure, the second floating gate structure is disposed on the substrate between the second doped region and the word line structure, the first control gate structure is disposed over the first floating gate structure, and the second control gate structure is disposed over the second floating gate structure, wherein the first doped region of the memory cell is connected with the first bit line, the second doped region of the memory cell is connected with the second bit line, the second doped region of the first isolation cell is connected with the first bit line, and the first doped region of the second isolation cell is connected with the second bit line, and wherein the first doped region of the first isolation cell serves as a connection terminal of the first isolation cell, the first control gate structure and the second control gate structure of the first isolation cell are connected together to serve as a control terminal of the first isolation cell, the second doped region of the second isolation cell serves as a connection terminal of the second isolation cell, the first control gate structure and the second control gate structure of the second isolation cell are connected together to serve as a control terminal of the second isolation cell.

Optionally, the memory may further include: a column decoding cell, a pull-up cell and a row decoding cell, wherein the row decoding cell is adapted to: apply voltage of 7V to 9V to the word line structure of the first isolation cell and apply voltage of −9V to −7V to the control terminal of the first isolation cell when a first erasing operation is performed to the first isolation cell; and apply voltage of 7V to 9V to the word line structure of the second isolation cell and apply voltage of −9V to −7V to the control terminal of the second isolation cell when a first erasing operation is performed to the second isolation cell, wherein the pull-up unit is adapted to: apply voltage of 0V to the first bit line when the first erasing operation is performed to the first isolation cell, and apply voltage of 0V to the second bit line when the first erasing operation is performed to the second isolation cell, and wherein the column decoding unit is adapted to: apply voltage of 0V to the connection terminal of the first isolation cell when the first erasing operation is performed to the first isolation cell, and apply voltage of 0V to the connection terminal of the second isolation cell when the first erasing operation is performed to the second isolation cell.

Optionally, the row decoding cell may be further adapted to: apply voltage of 2V to 5V to the word line structure of the first isolation cell and apply voltage of 2V to 5V to the control terminal of the first isolation cell when an erasing operation from a second time is performed to the first isolation cell; and apply voltage of 2V to 5V to the word line structure of the second isolation cell and apply voltage of 2V to 5V to the control terminal of the second isolation cell when an erasing operation from a second time is performed to the second isolation cell, wherein the pull-up unit may be further adapted to: apply voltage of 0V to the first bit line when the erasing operation from the second time is performed to the first isolation cell, and apply voltage of 0V to the second bit line when the erasing operation from the second time is performed to the second isolation cell, and wherein the column decoding unit may be further adapted to: apply voltage of 0V to the connection terminal of the first isolation cell when the erasing operation from the second time is performed to the first isolation cell, and apply voltage of 0V to the connection terminal of the second isolation cell when the erasing operation from the second time is performed to the second isolation cell.

Optionally, the memory may further include: a column decoding cell, a pull-up cell and a row decoding cell, wherein the row decoding cell is adapted to: apply voltage of 0V to the word line structure of the first isolation cell, apply voltage of 0V to the control terminal of the first isolation cell, apply voltage of 2V to 5V to the word line structure of the second isolation cell, apply voltage of 0V to the control terminal of the second isolation cell, apply voltage of 1.3V to 1.6V to the word line structure of the memory cell, apply voltage of 7V to 9V to the first control gate structure of the memory cell, and apply voltage of 4V to 6V to the second control gate structure of the memory cell when a programming operation is performed to the first floating gate structure in the memory cell; and apply voltage of 2V to 5V to the word line structure of the first isolation cell, apply voltage of 0V to the control terminal of the first isolation cell, apply voltage of 0V to the word line structure of the second isolation cell, apply voltage of 0V to the control terminal of the second isolation cell, apply voltage of 1.3V to 1.6V to the word line structure of the memory cell, apply voltage of 4V to 6V to the first control gate structure of the memory cell, and apply voltage of 7V to 9V to the second control gate structure of the memory cell when a programming operation is performed to the second floating gate structure in the memory cell, wherein the pull-up unit is adapted to: apply programming voltage idp to the first bit line, and apply voltage of 5V to 6V to the second bit line when the programming operation is performed to the first floating gate structure in the memory cell, and adapted to apply voltage of 5V to 6V to the first bit line, and apply the programming voltage idp to the second bit line when the programming operation is performed to the second floating gate structure in the memory cell, and wherein the column decoding unit is further adapted to: make the connection terminal of the first isolation cell and the connection terminal of the second isolation cell be floating when the programming operation is performed to the first floating gate structure in the memory cell, and make the connection terminal of the first isolation cell and the connection terminal of the second isolation cell be floating when the programming operation is performed to the second floating gate structure in the memory cell.

Optionally, the memory may further include: a column decoding cell, a pull-up cell and a row decoding cell, wherein the row decoding cell is adapted to: apply voltage of 2V to 5V to the word line structure of the first isolation cell, apply voltage of 2V to 5V to the control terminal of the first isolation cell, apply voltage of 2V to 5V to the word line structure of the second isolation cell, apply voltage of 2V to 5V to the control terminal of the second isolation cell, apply voltage of 2V to 5V to the word line structure of the memory cell, apply voltage of 0V to the first control gate structure of the memory cell, and apply voltage of 2.5V to 5V to the second control gate structure of the memory cell when a reading operation is performed to the first floating gate structure in the memory cell 1; and adapted to apply voltage of 2V to 5V to the word line structure of the first isolation cell, apply voltage of 2V to 5V to the control terminal of the first isolation cell, apply voltage of 2V to 5V to the word line structure of the second isolation cell, apply voltage of 2V to 5V to the control terminal of the second isolation cell, apply voltage of 2V to 5V to the word line structure of the memory cell, apply voltage of 2.5V to 5V to the first control gate structure of the memory cell, and apply voltage of 0V to the second control gate structure of the memory cell when a reading operation is performed to the second floating gate structure in the memory cell, wherein the pull-up unit is adapted to: apply voltage of 0V to the first bit line, and apply voltage of 0.4V to 0.8V to the second bit line when the reading operation is performed to the first floating gate structure in the memory cell, and adapted to apply voltage of 0.4V to 0.8V to the first bit line, and apply voltage of 0V to the second bit line when the reading operation is performed to the second floating gate structure in the memory cell, and wherein the column decoding unit is adapted to: apply voltage of 0.4V to 0.8V to the connection terminal of the first isolation cell and the connection terminal of the second isolation cell when the reading operation is performed to the first floating gate structure in the memory cell, and apply voltage of 0.4V to 0.8V to the connection terminal of the first isolation cell and the connection terminal of the second isolation cell when the reading operation is performed to the second floating gate structure in the memory cell.

Optionally, the memory may include more than one first isolation cells and/or more than one second isolation cells, wherein first doped regions of the first isolation cells are connected together, second doped regions of the first isolation cells are connected together, first doped regions of the second isolation cells are connected together, and second doped regions of the second isolation cells are connected together.

In an embodiment, a method for erasing a memory is provided, including: performing a first erasing operation to the first isolation cell and performing a first erasing operation to the second isolation cell, wherein performing the first erasing operation to the first isolation cell includes: applying voltage of 7V to 9V to the word line structure of the first isolation cell, applying voltage of −9V to −7V to the control terminal of the first isolation cell, applying voltage of 0V to the first bit line, and applying voltage of 0V to the connection terminal of the first isolation cell, and wherein performing the first erasing operation to the second isolation cell includes: applying voltage of 7V to 9V to the word line structure of the second isolation cell, applying voltage of −9V to −7V to the control terminal of the second isolation cell, applying voltage of 0V to the second bit line, and applying voltage of 0V to the connection terminal of the second isolation cell.

Optionally, the method may further include: performing another erasing operation to the first isolation cell and performing another erasing operation to the second isolation cell, where performing the another erasing operation to the first isolation cell includes: applying voltage of 2V to 5V to the word line structure of the first isolation cell, applying voltage of 2V to 5V to the control terminal of the first isolation cell, applying voltage of 0V to the first bit line, and applying voltage of 0V to the connection terminal of the first isolation cell, and wherein performing the another erasing operation to the second isolation cell includes: applying voltage of 2V to 5V to the word line structure of the second isolation cell, applying voltage of 2V to 5V to the control terminal of the second isolation cell, applying voltage of 0V to the second bit line, and applying voltage of 0V to the connection terminal of the second isolation cell.

In an embodiment, a method for programming a memory is provided, including: performing a programming operation to the first floating gate structure of the memory cell and performing a programming operation to the second floating gate structure of the memory cell, wherein performing the programming operation to the first floating gate structure of the memory cell includes: applying voltage of 0V to the word line structure of the first isolation cell, applying voltage of 0V to the control terminal of the first isolation cell, making the connection terminal of the first isolation cell be floating, applying voltage of 2V to 5V to the word line structure of the second isolation cell, applying voltage of 0V to the control terminal of the second isolation cell, making the connection terminal of the second isolation cell be floating, applying programming voltage idp to the first bit line, applying voltage of 5V to 6V to the second bit line, applying voltage of 1.3V to 1.6V to the word line structure of the memory cell, applying voltage of 7V to 9V to the first control gate structure of the memory cell, and applying voltage of 4V to 6V to the second control gate structure of the memory cell, and wherein performing the programming operation to the second floating gate structure of the memory cell includes: applying voltage of 2V to 5V to the word line structure of the first isolation cell, applying voltage of 0V to the control terminal of the first isolation cell, making the connection terminal of the first isolation cell be floating, applying voltage of 0V to the word line structure of the second isolation cell, applying voltage of 0V to the control terminal of the second isolation cell, making the connection terminal of the second isolation cell be floating, applying voltage of 5V to 6V to the first bit line, applying the programming voltage idp to the second bit line, applying voltage of 1.3V to 1.6V to the word line structure of the memory cell, applying voltage of 4V to 6V to the first control gate structure of the memory cell, and applying voltage of 7V to 9V to the second control gate structure of the memory cell.

In an embodiment, a method for reading a memory is provided, including: performing a reading operation to the first floating gate structure of the memory cell and performing a reading operation to the second floating gate structure of the memory cell, wherein performing the reading operation to the first floating gate structure of the memory cell includes: applying voltage of 2V to 5V to the word line structure of the first isolation cell, applying voltage of 2V to 5V to the control terminal of the first isolation cell, applying voltage of 0.4V to 0.8V to the connection terminal of the first isolation cell, applying voltage of 2V to 5V to the word line structure of the second isolation cell, applying voltage of 2V to 5V to the control terminal of the second isolation cell, applying voltage of 0.4V to 0.8V to the connection terminal of the second isolation cell, applying voltage of 0V to the first bit line, applying voltage of 0.4V to 0.8V to the second bit line, applying voltage of 2V to 5V to the word line structure of the memory cell, applying voltage of 0V to the first control gate structure of the memory cell, and applying voltage of 2.5V to 5V to the second control gate structure of the memory cell, and wherein performing the reading operation to the second floating gate structure of the memory cell includes: apply voltage of 2V to 5V to the word line structure of the first isolation cell, apply voltage of 2V to 5V to the control terminal of the first isolation cell, apply voltage of 0.4V to 0.8V to the connection terminal of the first isolation cell, apply voltage of 2V to 5V to the word line structure of the second isolation cell, apply voltage of 2V to 5V to the control terminal of the second isolation cell, apply voltage of 0.4V to 0.8V to the connection terminal of the second isolation cell, apply voltage of 0.4V to 0.8V to the first bit line, apply voltage of 0V to the second bit line, apply voltage of 2V to 5V to the word line structure of the memory cell, apply voltage of 2.5V to 5V to the first control gate structure of the memory cell, and apply voltage of 0V to the second control gate structure of the memory cell.

Embodiments of the present disclosure may have following advantages. The first isolation cell and the second isolation cell have an isolation function similar as that of existing isolation transistors, and have a same structure with the memory cell. Besides, the first isolation cell and the second isolation cell have much smaller size compared with the existing isolation transistors, so that an area of the memory is reduced accordingly.

DETAILED DESCRIPTION

In order to clarify the objects, characteristics and advantages of the disclosure, embodiments of present disclosure will be described in detail in conjunction with accompanying drawings.

Figure 3:
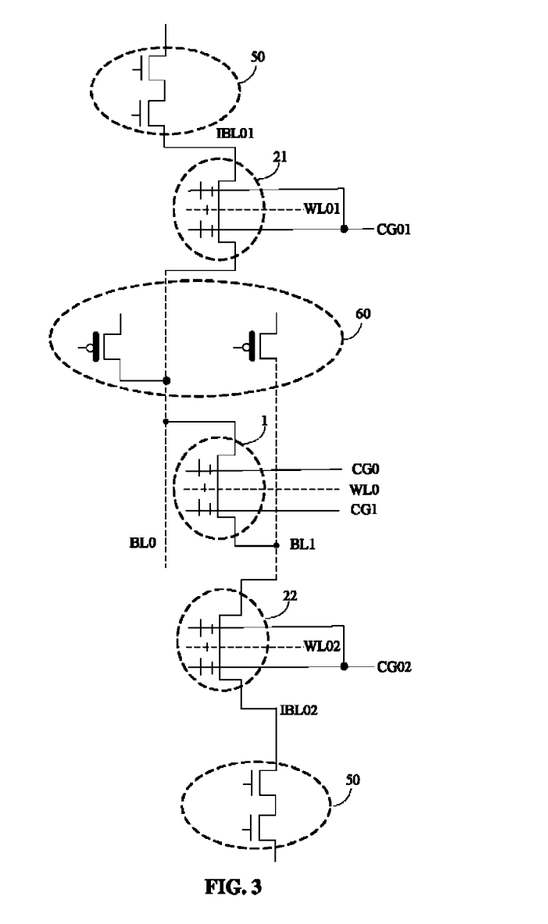
FIG. 3 schematically illustrates a circuit diagram of a memory according to an embodiment of the present disclosure.

Referring to FIG. 3, in an embodiment, a memory is provided, including a first bit line BL0, a second bit line BL1, and a memory cell 1, a first isolation cell 21 and a second isolation cell 22 which are disposed in a same column.

Figure 4:
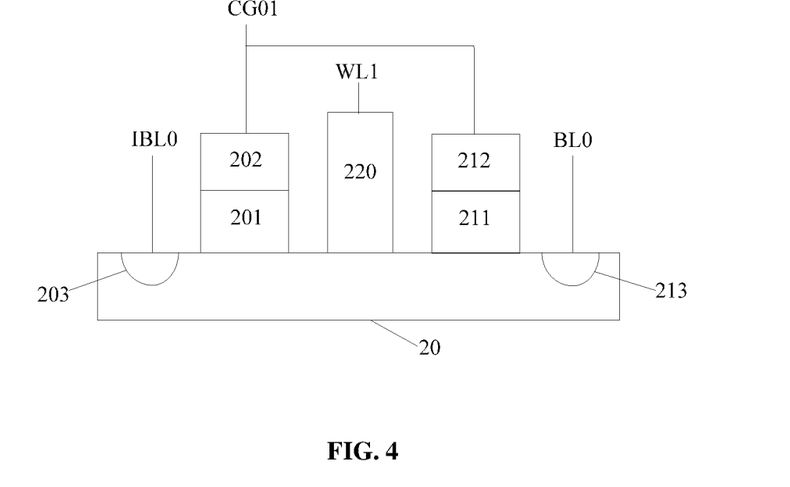
FIG. 4 schematically illustrates a structural diagram of a first isolation cell according to an embodiment of the present disclosure.

Both the first and the second isolation cells have a same structure with the memory cell 1. Here, take the first isolation cell 21 for example. Referring to FIG. 4, similar with the memory cell described in background, the first isolation cell 21 includes: a substrate 20, a first control gate structure 202, a second control gate structure 212, a first floating gate structure 201, a second floating gate structure 211 and a word line structure 220 that are disposed on the substrate 20, and a first doped region 203 and a second doped region 213 disposed in the substrate 20.

The first floating gate structure 201 is disposed on the substrate 20 between the first doped region 203 and the word line structure 220, and the second floating gate structure 211 is disposed on the substrate 20 between the second doped region 213 and the word line structure 220. The first control gate structure 202 is disposed over the first floating gate structure 201, and the second control gate structure 212 is disposed over the second floating gate structure 211.

Referring to FIGS. 3 and 4, the second doped region 213 of the first isolation cell 21 is connected with the first bit line BL0, and the first doped region 203 of the second isolation cell 22 is connected with the second bit line BL1.

The first doped region 203 of the first isolation cell 21 serves as a connection terminal IBL01 of the first isolation cell 21, the first control gate structure 202 and the second control gate structure 212 of the first isolation cell 21 are connected together to serve as a control terminal CG01 of the first isolation cell 21.

The second doped region 213 of the second isolation cell 22 serves as a connection terminal IBL02 of the second isolation cell 22, the first control gate structure 202 and the second control gate structure 212 of the second isolation cell 22 are connected together to serve as a control terminal CG02 of the second isolation cell 22.

Referring to FIGS. 3 and 1, the first doped region 103 of the memory cell 1 is connected with the first bit line BL0, the second doped region 113 of the memory cell 1 is connected with the second bit line BL1.

In some embodiments, the memory may further include: a column decoding cell 50, a pull-up cell 60 and a row decoding cell (not shown).

In some embodiments, the row decoding cell applies voltage to the word line structure 12 of the memory cell 1 through the first bit line WL0, applies voltage to the word line structure 220 of the first isolation cell 21 through the second bit line WL01, applies voltage to the word line structure 220 of the second isolation cell 22 through the third bit line WL02, applies voltage to the first control gate structure 102 of the memory cell 1 through the first control line CG0, applies voltage to the second control gate structure 112 of the memory cell 1 through the second control line CG1, applies voltage to the first control gate structure 202 and the second control gate structure 212 of the first isolation cell 21 through a third control line CG01 (i.e., the control terminal of the first isolation cell 21), applies voltage to the first control gate structure 202 and the second control gate structure 212 of the second isolation cell 22 through a fourth control line CG02 (i.e., the control terminal of the second isolation cell 22). The pull-up unit 60 applies voltage to the first bit line BL0 and the second bit line BL1. The column decoding unit 50 applies voltage to the connection terminal IBL01 of the first isolation cell 21 and the connection terminal IBL02 of the second isolation cell 22.

TABLE 1

| | WL01 | CG01 | BL0 | IBL01 |
|---|---|---|---|---|
| The first isolation cell 21 | | | | |
| First erasing | 7 V~9 V | −7 V~−9 V | 0 V | 0 V |

TABLE 1-continued

| | WL02 | CG02 | BL1 | IBL02 |
|---|---|---|---|---|
| The second isolation cell 22 | | | | |
| First erasing | 7 V~9 V | −7 V~−9 V | 0 V | 0 V |

From Table 1, the row decoding cell may be adapted to apply voltage of 7V to 9V to the word line structure 220 of the first isolation cell 21, and apply voltage of −9V to −7V to the control terminal CG01 of the first isolation cell 21 when a first erasing operation is performed to the first isolation cell 21. Besides, the row decoding cell may be further adapted to apply voltage of 7V to 9V to the word line structure 220 of the second isolation cell 22, and apply voltage of −9V to −7V to the control terminal CG02 of the second isolation cell 22 when a first erasing operation is performed to the second isolation cell 22.

Referring to Table 1, the pull-up unit 60 may be adapted to apply voltage of 0V to the first bit line BL0 when the first erasing operation is performed to the first isolation cell 21, and apply voltage of 0V to the second bit line BL1 when the first erasing operation is performed to the second isolation cell 22.

Still referring to Table 1, the column decoding unit 50 may be adapted to apply voltage of 0V to the connection terminal IBL01 of the first isolation cell 21 when the first erasing operation is performed to the first isolation cell 21, and apply voltage of 0V to the connection terminal IBL02 of the second isolation cell 22 when the first erasing operation is performed to the second isolation cell 22.

TABLE 2

| | WL01 | CG01 | BL0 | IBL01 |
|---|---|---|---|---|
| The first isolation cell 21 | | | | |
| Erasing from a second time | 2 V~5 V | 2 V~5 V | 0 V | 0 V |
| | WL02 | CG02 | BL1 | IBL02 |
| The second isolation cell 22 | | | | |
| Erasing from a second time | 2 V~5 V | 2 V~5 V | 0 V | 0 V |

From Table 2, the row decoding cell may be further adapted to apply voltage of 2V to 5V to the word line structure 220 of the first isolation cell 21, and apply voltage of 2V to 5V to the control terminal CG01 of the first isolation cell 21 when an erasing operation from a second time is performed to the first isolation cell 21. Besides, the row decoding cell may be further adapted to apply voltage of 2V to 5V to the word line structure 220 of the second isolation cell 22, and apply voltage of 2V to 5V to the control terminal CG02 of the second isolation cell 22 when an erasing operation from a second time is performed to the second isolation cell 22.

Referring to Table 2, the pull-up unit 60 may be further adapted to apply voltage of 0V to the first bit line BL0 when the erasing operation from the second time is performed to the first isolation cell 21, and apply voltage of 0V to the second bit line BL1 when the erasing operation from the second time is performed to the second isolation cell 22.

Still referring to Table 2, the column decoding unit 50 may be further adapted to apply voltage of 0V to the connection terminal IBL01 of the first isolation cell 21 when the erasing operation from the second time is performed to the first isolation cell 21, and apply voltage of 0V to the connection terminal IBL02 of the second isolation cell 22 when the erasing operation from the second time is performed to the second isolation cell 22.

The erasing operation from the second time denotes to any erasing operation other than the first erasing operation. In the above embodiments, as having a same structure with the memory cell 1, the first isolation cell 21 and the second isolation cell 22 also need to be erased. In some embodiments, the erasing operation to the memory cell 1, the first isolation cell 21 and the second isolation cell 22 may be performed row by row.

In some embodiments, when a programming operation or a reading operation is performed to the memory cell 1, voltages applied to the first isolation cell 21 and the second isolation cell 22 are shown in Table 3.

BL0, and apply voltage of 5V to 6V to the second bit line BL1 when the programming operation is performed to the first floating gate structure 101 in the memory cell 1, and adapted to apply voltage of 5V to 6V to the first bit line BL0, and apply the programming voltage idp to the second bit line BL1 when the programming operation is performed to the second floating gate structure 111 in the memory cell 1. The programming

TABLE 3

|  | WL01 | CG01 | IBL01 | WL02 | CG02 | IBL02 | BL0 | BL1 | WL0 | CG0 | CG1 |
|---|---|---|---|---|---|---|---|---|---|---|---|
| The first floating gate structure 101 |  |  |  |  |  |  |  |  |  |  |  |
| Programming | 0 V | 0 V | floating | 2 V~5 V | 0V | floating | idp | 5 V~6 V | 1.3 V~1.6 V | 7 V~9 V | 5 V |
| The second floating gate structure 111 |  |  |  |  |  |  |  |  |  |  |  |
| Programming | 2 V~5 V | 0 V | floating | 0 V | 0 V | floating | 5 V~6 V | idp | 1.3 V~1.6 V | 5 V | 7 V~9 V |

From Table 3, the row decoding cell may be further adapted to apply voltage of 0V to the word line structure 220 of the first isolation cell 21, apply voltage of 0V to the control terminal CG01 of the first isolation cell 21, apply voltage of 2V to 5V to the word line structure 220 of the second isolation cell 22, apply voltage of 0V to the control terminal CG02 of the second isolation cell 22, apply voltage of 1.3V to 1.6V to the word line structure 12 of the memory cell 1, apply voltage of 7V to 9V to the first control gate structure 102 of the memory cell 1, and apply voltage of 4V to 6V to the second control gate structure 112 of the memory cell 1 when a programming operation is performed to the first floating gate structure 101 in the memory cell 1. Besides, the row decoding cell may be further adapted to apply voltage of 2V to 5V to the word line structure 220 of the first isolation cell 21, apply voltage of 0V to the control terminal CG01 of the first isolacurrent idp may be programming current of a memory cell that is employed in existing techniques and is not described in detail here.

Still referring to Table 3, the column decoding unit 50 may be further adapted to make the connection terminal IBL01 of the first isolation cell 21 and the connection terminal IBL02 of the second isolation cell 22 be floating when the programming operation is performed to the first floating gate structure 101 in the memory cell 1, and make the connection terminal IBL01 of the first isolation cell 21 and the connection terminal IBL02 of the second isolation cell 22 be floating when the programming operation is performed to the second floating gate structure 111 in the memory cell 1.

TABLE 4

|  | WL01 | CG01 | IBL01 | WL02 | CG02 | IBL02 | BL0 | BL1 | WL0 | CG0 | CG1 |
|---|---|---|---|---|---|---|---|---|---|---|---|
| The first floating gate structure 101 |  |  |  |  |  |  |  |  |  |  |  |
| Reading | 2 V~5 V | 2 V~5 V | 0.4 V~0.08 V | 2 V~5 V | 2 V~5 V | 0.4 V~0.08 V | 0 V | 0.4 V~0.8 V | 2 V~5 V | 0 V | 2.5 V~5 V |
| The second floating gate structure 111 |  |  |  |  |  |  |  |  |  |  |  |
| Reading | 2 V~5 V | 2 V~5 V | 0.4 V~0.08 V | 2 V~5 V | 2 V~5 V | 0.4 V~0.08 V | 0.4 V~0.8 V | 0 V | 2 V~5 V | 2.5 V~5 V | 0 V | tion cell 21, apply voltage of 0V to the word line structure 220 of the second isolation cell 22, apply voltage of 0V to the control terminal CG02 of the second isolation cell 22, apply voltage of 1.3V to 1.6V to the word line structure 12 of the memory cell 1, apply voltage of 4V to 6V to the first control gate structure 102 of the memory cell 1, and apply voltage of 7V to 9V to the second control gate structure 112 of the memory cell 1 when a programming operation is performed to the second floating gate structure 111 in the memory cell 1.

Referring to Table 3, the pull-up unit 60 may be further adapted to apply programming voltage idp to the first bit line From Table 4, the row decoding cell may be further adapted to apply voltage of 2V to 5V to the word line structure 220 of the first isolation cell 21, apply voltage of 2V to 5V to the control terminal CG01 of the first isolation cell 21, apply voltage of 2V to 5V to the word line structure 220 of the second isolation cell 22, apply voltage of 2V to 5V to the control terminal CG02 of the second isolation cell 22, apply voltage of 2V to 5V to the word line structure 12 of the memory cell 1, apply voltage of 0V to the first control gate structure 102 of the memory cell 1, and apply voltage of 2.5V to 5V to the second control gate structure 112 of the memory cell 1 when a reading operation is performed to the first floating gate structure 101 in the memory cell 1. Besides, the row decoding cell may be further adapted to apply voltage of 2V to 5V to the word line structure 220 of the first isolation cell 21, apply voltage of 2V to 5V to the control terminal CG01 of the first isolation cell 21, apply voltage of 2V to 5V to the word line structure 220 of the second isolation cell 22, apply voltage of 2V to 5V to the control terminal CG02 of the second isolation cell 22, apply voltage of 2V to 5V to the word line structure 12 of the memory cell 1, apply voltage of 2.5V to 5V to the first control gate structure 102 of the memory cell 1, and apply voltage of 0V to the second control gate structure 112 of the memory cell 1 when a reading operation is performed to the second floating gate structure 111 in the memory cell 1.

Referring to Table 4, the pull-up unit 60 may be further adapted to apply voltage of 0V to the first bit line BL0, and apply voltage of 0.4V to 0.8V to the second bit line BL1 when the reading operation is performed to the first floating gate structure 101 in the memory cell 1, and adapted to apply voltage of 0.4V to 0.8V to the first bit line BL0, and apply voltage of 0V to the second bit line BL1 when the reading operation is performed to the second floating gate structure 111 in the memory cell 1.

Still referring to Table 4, the column decoding unit 50 may be further adapted to apply voltage of 0.4V to 0.8V to the connection terminal IBL01 of the first isolation cell 21 and the connection terminal IBL02 of the second isolation cell 22 when the reading operation is performed to the first floating gate structure 101 in the memory cell 1, and apply voltage of 0.4V to 0.8V to the connection terminal IBL01 of the first isolation cell 21 and the connection terminal IBL02 of the second isolation cell 22 when the reading operation is performed to the second floating gate structure 111 in the memory cell 1.

In the above operations, the first isolation cell 21 and the second isolation cell 22 have an isolation function similar as that of existing isolation transistors, and have much smaller size compared with the existing isolation transistors, so that an area of the memory is reduced accordingly.

In some embodiments, there are more than one first isolation cells and more than one second isolation cells. First doped regions of the first isolation cells are connected together, and second doped regions of the first isolation cells are connected together. First doped regions of the second isolation cells are connected together, and second doped regions of the second isolation cells are connected together.

Figure 5:
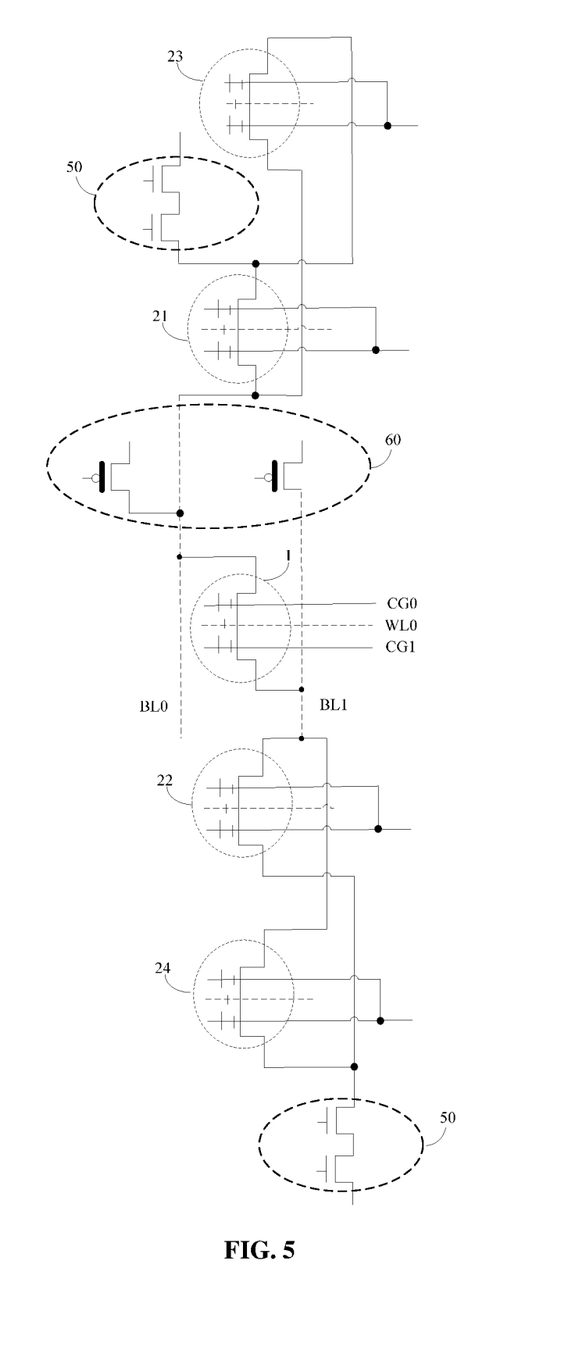
FIG. 5 schematically illustrates a circuit diagram of a memory according to another embodiment of the present disclosure.

Referring to FIG. 5, two first isolation cells (a first isolation cell 21 and a first isolation cell 23) and two second isolation cells (a second isolation cell 22 and a second isolation cell 24) are illustrated. A first doped region of the first isolation cell 21 and a first doped region of the first isolation cell 23 are connected together, and a second doped region of the first isolation cell 21 and a second doped region of the first isolation cell 23 are connected together. A first doped region of the second isolation cell 22 and a first doped region of the second isolation cell 24 are connected together, and a second doped region of the second isolation cell 22 and a second doped region of the second isolation cell 24 are connected together. Voltages applied in an erasing operation, a programming operation and a reading operation to the first isolation cell 23 or the second isolation cell 24 are similar with the first isolation cell 21 or the second isolation cell 22. More information about the first isolation cell 23 and the second isolation cell 24 can be referred to the above description of the first isolation cell 21 and the second isolation cell 22, and is not described in detail here.

In above embodiments, connections of the memory cell, the first isolation cell and the second isolation cell in the same column, the first bit line and the second bit lines are described. Besides, the erasing operation, the programming operation and the reading operation to the memory are also described. In practice, the memory may include a plurality of columns. In some embodiments, M-by-N (M rows and N columns) memory cells constitute a memory cell array, where M>=1, N>=1. m-by-N (m rows and N columns) first isolation cells constitute a first isolation cell array, where m>=1. n-by-N (n rows and N columns) second isolation cells constitute a second isolation cell array, where n>=1. On the column direction, the first isolation cell array and the second isolation cell array are disposed on two sides of the memory cell array, respectively, and columns in the three arrays are disposed aligned with each other.

In an embodiment, a method for erasing the above memory is provided, including: performing a first erasing operation to the first isolation cell 21 and performing a first erasing operation to the second isolation cell 22, wherein performing the first erasing operation to the first isolation cell 21 includes: applying voltage of 7V to 9V to the word line structure 220 of the first isolation cell 21, applying voltage of −9V to −7V to the control terminal CG01 of the first isolation cell 21, applying voltage of 0V to the first bit line BL0, and applying voltage of 0V to the connection terminal IBL01 of the first isolation cell 21, and wherein performing the first erasing operation to the second isolation cell 22 includes: applying voltage of 7V to 9V to the word line structure 220 of the second isolation cell 22, applying voltage of −9V to −7V to the control terminal CG02 of the second isolation cell 22, applying voltage of 0V to the second bit line BL1, and applying voltage of 0V to the connection terminal IBL02 of the second isolation cell 22.

In some embodiments, the method may further include: performing another erasing operation to the first isolation cell 21 and performing another erasing operation to the second isolation cell 22, where performing the another erasing operation to the first isolation cell 21 includes: applying voltage of 2V to 5V to the word line structure 220 of the first isolation cell 21, applying voltage of 2V to 5V to the control terminal CG01 of the first isolation cell 21, applying voltage of 0V to the first bit line BL0, and applying voltage of 0V to the connection terminal IBL01 of the first isolation cell 21, and wherein performing the another erasing operation to the second isolation cell 22 includes: applying voltage of 2V to 5V to the word line structure 220 of the second isolation cell 22, applying voltage of 2V to 5V to the control terminal CG02 of the second isolation cell 22, applying voltage of 0V to the second bit line BL1, and applying voltage of 0V to the connection terminal IBL02 of the second isolation cell 22.

In some embodiments, the method may further include performing an erasing operation to the memory cell 1, wherein performing the erasing operation to the memory cell 1 includes: applying voltage of 7V to 9V to the word line structure 12 of the memory cell 1, applying voltage of −9V to −7V to the first control gate structure 102 of the memory cell 1, applying voltage of −9V to −7V to the second control gate structure 112 of the memory cell 1, applying voltage of 0V to the first bit line BL0, and applying voltage of 0V to the second bit line BL1.

In an embodiment, a method for programming the above memory is provided, including: performing a programming operation to the first floating gate structure 101 of the memory cell 1 and performing a programming operation to the second floating gate structure 111 of the memory cell 1, wherein performing the programming operation to the first floating gate structure 101 of the memory cell 1 includes: applying voltage of 0V to the word line structure 220 of the first isolation cell 21, applying voltage of 0V to the control terminal CG01 of the first isolation cell 21, making the connection terminal IBL01 of the first isolation cell 21 be floating, applying voltage of 2V to 5V to the word line structure 220 of the second isolation cell 22, applying voltage of 0V to the control terminal CG02 of the second isolation cell 22, making the connection terminal IBL02 of the second isolation cell 22 be floating, applying programming voltage idp to the first bit line BL0, applying voltage of 5V to 6V to the second bit line BL1, applying voltage of 1.3V to 1.6V to the word line structure 12 of the memory cell 1, applying voltage of 7V to 9V to the first control gate structure 102 of the memory cell 1, and applying voltage of 4V to 6V to the second control gate structure 112 of the memory cell 1, and wherein performing the programming operation to the second floating gate structure 111 of the memory cell 1 includes: applying voltage of 2V to 5V to the word line structure 220 of the first isolation cell 21, applying voltage of 0V to the control terminal CG01 of the first isolation cell 21, making the connection terminal IBL01 of the first isolation cell 21 be floating, applying voltage of 0V to the word line structure 220 of the second isolation cell 22, applying voltage of 0V to the control terminal CG02 of the second isolation cell 22, making the connection terminal IBL02 of the second isolation cell 22 be floating, applying voltage of 5V to 6V to the first bit line BL0, applying the programming voltage idp to the second bit line BL1, applying voltage of 1.3V to 1.6V to the word line structure 12 of the memory cell 1, applying voltage of 4V to 6V to the first control gate structure 102 of the memory cell 1, and applying voltage of 7V to 9V to the second control gate structure 112 of the memory cell.

In an embodiment, a method for reading the above memory is provided, including: performing a reading operation to the first floating gate structure 101 of the memory cell 1 and performing a reading operation to the second floating gate structure 111 of the memory cell 1, wherein performing the reading operation to the first floating gate structure 101 of the memory cell 1 includes: applying voltage of 2V to 5V to the word line structure 220 of the first isolation cell 21, applying voltage of 2V to 5V to the control terminal CG01 of the first isolation cell 21, applying voltage of 0.4V to 0.8V to the connection terminal IBL01 of the first isolation cell 21, applying voltage of 2V to 5V to the word line structure 220 of the second isolation cell 22, applying voltage of 2V to 5V to the control terminal CG02 of the second isolation cell 22, applying voltage of 0.4V to 0.8V to the connection terminal IBL02 of the second isolation cell 22, applying voltage of 0V to the first bit line BL0, applying voltage of 0.4V to 0.8V to the second bit line BL1, applying voltage of 2V to 5V to the word line structure 12 of the memory cell 1, applying voltage of 0V to the first control gate structure 102 of the memory cell 1, and applying voltage of 2.5V to 5V to the second control gate structure 112 of the memory cell 1, and wherein performing the reading operation to the second floating gate structure 111 of the memory cell 1 includes: apply voltage of 2V to 5V to the word line structure 220 of the first isolation cell 21, apply voltage of 2V to 5V to the control terminal CG01 of the first isolation cell 21, apply voltage of 0.4V to 0.8V to the connection terminal IBL01 of the first isolation cell 21, apply voltage of 2V to 5V to the word line structure 220 of the second isolation cell 22, apply voltage of 2V to 5V to the control terminal CG02 of the second isolation cell 22, apply voltage of 0.4V to 0.8V to the connection terminal IBL02 of the second isolation cell 22, apply voltage of 0.4V to 0.8V to the first bit line BL0, apply voltage of 0V to the second bit line BL1, apply voltage of 2V to 5V to the word line structure 12 of the memory cell 1, apply voltage of 2.5V to 5V to the first control gate structure 102 of the memory cell 1, and apply voltage of 0V to the second control gate structure 112 of the memory cell 1.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A memory, comprising:
a first bit line, a second bit line, and a memory cell, a first isolation cell and a second isolation cell which are disposed in a same column, wherein the first isolation cell, the second isolation cell and the memory cell have a same structure,
wherein the first isolation cell comprises: a substrate, a first control gate structure, a second control gate structure, a first floating gate structure, a second floating gate structure and a word line structure that are disposed on the substrate, and a first doped region and a second doped region disposed in the substrate, wherein the first floating gate structure is disposed on the substrate between the first doped region and the word line structure, the second floating gate structure is disposed on the substrate between the second doped region and the word line structure, the first control gate structure is disposed over the first floating gate structure, and the second control gate structure is disposed over the second floating gate structure,
wherein a first doped region of the memory cell is connected with the first bit line, a second doped region of the memory cell is connected with the second bit line, the second doped region of the first isolation cell is connected with the first bit line, and a first doped region of the second isolation cell is connected with the second bit line, and
wherein the first doped region of the first isolation cell serves as a connection terminal of the first isolation cell, the first control gate structure and the second control gate structure of the first isolation cell are connected together to serve as a control terminal of the first isolation cell, a second doped region of the second isolation cell serves as a connection terminal of the second isolation cell, and a first control gate structure and a second control gate structure of the second isolation cell are connected together to serve as a control terminal of the second isolation cell.

2. The memory according to claim 1, further comprising:
a column decoding cell, a pull-up cell and a row decoding cell,
wherein the row decoding cell is adapted to: apply voltage of 7V to 9V to the word line structure of the first isolation cell and apply voltage of −9V to −7V to the control terminal of the first isolation cell when a first erasing operation is performed to the first isolation cell; and apply voltage of 7V to 9V to a word line structure of the second isolation cell and apply voltage of −9V to −7V to the control terminal of the second isolation cell when a first erasing operation is performed to the second isolation cell,
wherein the pull-up unit is adapted to: apply voltage of 0V to the first bit line when the first erasing operation is performed to the first isolation cell, and apply voltage of 0V to the second bit line when the first erasing operation is performed to the second isolation cell, and wherein the column decoding unit is adapted to: apply voltage of 0V to the connection terminal of the first isolation cell when the first erasing operation is performed to the first isolation cell, and apply voltage of 0V to the connection terminal of the second isolation cell when the first erasing operation is performed to the second isolation cell.

3. The memory according to claim 2, wherein the row decoding cell is further adapted to: apply voltage of 2V to 5V to the word line structure of the first isolation cell and apply voltage of 2V to 5V to the control terminal of the first isolation cell when an erasing operation from a second time is performed to the first isolation cell; and apply voltage of 2V to 5V to the word line structure of the second isolation cell and apply voltage of 2V to 5V to the control terminal of the second isolation cell when an erasing operation from a second time is performed to the second isolation cell, wherein the pull-up unit is further adapted to: apply voltage of 0V to the first bit line when the erasing operation from the second time is performed to the first isolation cell, and apply voltage of 0V to the second bit line when the erasing operation from the second time is performed to the second isolation cell, and wherein the column decoding unit is further adapted to: apply voltage of 0V to the connection terminal of the first isolation cell when the erasing operation from the second time is performed to the first isolation cell, and apply voltage of 0V to the connection terminal of the second isolation cell when the erasing operation from the second time is performed to the second isolation cell.

4. The memory according to claim 1, further comprising:
a column decoding cell, a pull-up cell and a row decoding cell, wherein the row decoding cell is adapted to: apply voltage of 0V to the word line structure of the first isolation cell, apply voltage of 0V to the control terminal of the first isolation cell, apply voltage of 2V to 5V to a word line structure of the second isolation cell, apply voltage of 0V to the control terminal of the second isolation cell, apply voltage of 1.3V to 1.6V to a word line structure of the memory cell, apply voltage of 7V to 9V to a first control gate structure of the memory cell, and apply voltage of 4V to 6V to a second control gate structure of the memory cell when a programming operation is performed to a first floating gate structure in the memory cell; and apply voltage of 2V to 5V to the word line structure of the first isolation cell, apply voltage of 0V to the control terminal of the first isolation cell, apply voltage of 0V to the word line structure of the second isolation cell, apply voltage of 0V to the control terminal of the second isolation cell, apply voltage of 1.3V to 1.6V to the word line structure of the memory cell, apply voltage of 4V to 6V to the first control gate structure of the memory cell, and apply voltage of 7V to 9V to the second control gate structure of the memory cell when a programming operation is performed to a second floating gate structure in the memory cell, wherein the pull-up unit is adapted to: apply programming voltage idp to the first bit line, and apply voltage of 5V to 6V to the second bit line when the programming operation is performed to the first floating gate structure in the memory cell, and adapted to apply voltage of 5V to 6V to the first bit line, and apply the programming voltage idp to the second bit line when the programming operation is performed to the second floating gate structure in the memory cell, and wherein the column decoding unit is further adapted to: make the connection terminal of the first isolation cell and the connection terminal of the second isolation cell be floating when the programming operation is performed to the first floating gate structure in the memory cell, and make the connection terminal of the first isolation cell and the connection terminal of the second isolation cell be floating when the programming operation is performed to the second floating gate structure in the memory cell.

5. The memory according to claim 1, further comprising:
a column decoding cell, a pull-up cell and a row decoding cell, wherein the row decoding cell is adapted to: apply voltage of 2V to 5V to the word line structure of the first isolation cell, apply voltage of 2V to 5V to the control terminal of the first isolation cell, apply voltage of 2V to 5V to a word line structure of the second isolation cell, apply voltage of 2V to 5V to the control terminal of the second isolation cell, apply voltage of 2V to 5V to a word line structure of the memory cell, apply voltage of 0V to a first control gate structure of the memory cell, and apply voltage of 2.5V to 5V to a second control gate structure of the memory cell when a reading operation is performed to a first floating gate structure in the memory cell 1; and adapted to apply voltage of 2V to 5V to the word line structure of the first isolation cell, apply voltage of 2V to 5V to the control terminal of the first isolation cell, apply voltage of 2V to 5V to the word line structure of the second isolation cell, apply voltage of 2V to 5V to the control terminal of the second isolation cell, apply voltage of 2V to 5V to a word line structure of the memory cell, apply voltage of 2.5V to 5V to the first control gate structure of the memory cell, and apply voltage of 0V to the second control gate structure of the memory cell when a reading operation is performed to a second floating gate structure in the memory cell, wherein the pull-up unit is adapted to: apply voltage of 0V to the first bit line, and apply voltage of 0.4V to 0.8V to the second bit line when the reading operation is performed to the first floating gate structure in the memory cell, and adapted to apply voltage of 0.4V to 0.8V to the first bit line, and apply voltage of 0V to the second bit line when the reading operation is performed to the second floating gate structure in the memory cell, and wherein the column decoding unit is adapted to: apply voltage of 0.4V to 0.8V to the connection terminal of the first isolation cell and the connection terminal of the second isolation cell when the reading operation is performed to the first floating gate structure in the memory cell, and apply voltage of 0.4V to 0.8V to the connection terminal of the first isolation cell and the connection terminal of the second isolation cell when the reading operation is performed to the second floating gate structure in the memory cell.

6. The memory according to claim 1, wherein the memory comprises more than one first isolation cells and/or more than one second isolation cells, wherein first doped regions of the first isolation cells are connected together, second doped regions of the first isolation cells are connected together, first doped regions of the second isolation cells are connected together, and second doped regions of the second isolation cells are connected together.

7. A method for erasing the memory according to claim 1, comprising:
 performing a first erasing operation to the first isolation cell and performing a first erasing operation to the second isolation cell,
 wherein performing the first erasing operation to the first isolation cell comprises: applying voltage of 7V to 9V to the word line structure of the first isolation cell, applying voltage of −9V to −7V to the control terminal of the first isolation cell, applying voltage of 0V to the first bit line, and applying voltage of 0V to the connection terminal of the first isolation cell, and
 wherein performing the first erasing operation to the second isolation cell comprises: applying voltage of 7V to 9V to a word line structure of the second isolation cell, applying voltage of −9V to −7V to the control terminal of the second isolation cell, applying voltage of 0V to the second bit line, and applying voltage of 0V to the connection terminal of the second isolation cell.

8. The method according to claim 7, further comprising:
 performing another erasing operation to the first isolation cell and performing another erasing operation to the second isolation cell,
 wherein performing the another erasing operation to the first isolation cell comprises: applying voltage of 2V to 5V to the word line structure of the first isolation cell, applying voltage of 2V to 5V to the control terminal of the first isolation cell, applying voltage of 0V to the first bit line, and applying voltage of 0V to the connection terminal of the first isolation cell, and
 wherein performing the another erasing operation to the second isolation cell comprises: applying voltage of 2V to 5V to the word line structure of the second isolation cell, applying voltage of 2V to 5V to the control terminal of the second isolation cell, applying voltage of 0V to the second bit line, and applying voltage of 0V to the connection terminal of the second isolation cell.

9. A method for programming the memory according to claim 1, comprising:
 performing a programming operation to a first floating gate structure of the memory cell and performing a programming operation to a second floating gate structure of the memory cell,
 wherein performing the programming operation to the first floating gate structure of the memory cell comprises: applying voltage of 0V to the word line structure of the first isolation cell, applying voltage of 0V to the control terminal of the first isolation cell, making the connection terminal of the first isolation cell be floating, applying voltage of 2V to 5V to a word line structure of the second isolation cell, applying voltage of 0V to the control terminal of the second isolation cell, making the connection terminal of the second isolation cell be floating, applying programming voltage idp to the first bit line, applying voltage of 5V to 6V to the second bit line, applying voltage of 1.3V to 1.6V to a word line structure of the memory cell, applying voltage of 7V to 9V to a first control gate structure of the memory cell, and applying voltage of 4V to 6V to a second control gate structure of the memory cell, and
 wherein performing the programming operation to the second floating gate structure of the memory cell comprises: applying voltage of 2V to 5V to the word line structure of the first isolation cell, applying voltage of 0V to the control terminal of the first isolation cell, making the connection terminal of the first isolation cell be floating, applying voltage of 0V to the word line structure of the second isolation cell, applying voltage of 0V to the control terminal of the second isolation cell, making the connection terminal of the second isolation cell be floating, applying voltage of 5V to 6V to the first bit line, applying the programming voltage idp to the second bit line, applying voltage of 1.3V to 1.6V to the word line structure of the memory cell, applying voltage of 4V to 6V to the first control gate structure of the memory cell, and applying voltage of 7V to 9V to the second control gate structure of the memory cell.

10. A method for reading the memory according to claim 1, comprising:
 performing a reading operation to a first floating gate structure of the memory cell and performing a reading operation to a second floating gate structure of the memory cell,
 wherein performing the reading operation to the first floating gate structure of the memory cell comprises: applying voltage of 2V to 5V to the word line structure of the first isolation cell, applying voltage of 2V to 5V to the control terminal of the first isolation cell, applying voltage of 0.4V to 0.8V to the connection terminal of the first isolation cell, applying voltage of 2V to 5V to a word line structure of the second isolation cell, applying voltage of 2V to 5V to the control terminal of the second isolation cell, applying voltage of 0.4V to 0.8V to the connection terminal of the second isolation cell, applying voltage of 0V to the first bit line, applying voltage of 0.4V to 0.8V to the second bit line, applying voltage of 2V to 5V to a word line structure of the memory cell, applying voltage of 0V to a first control gate structure of the memory cell, and applying voltage of 2.5V to 5V to a second control gate structure of the memory cell, and
 wherein performing the reading operation to the second floating gate structure of the memory cell comprises: apply voltage of 2V to 5V to the word line structure of the first isolation cell, apply voltage of 2V to 5V to the control terminal of the first isolation cell, apply voltage of 0.4V to 0.8V to the connection terminal of the first isolation cell, apply voltage of 2V to 5V to the word line structure of the second isolation cell, apply voltage of 2V to 5V to the control terminal of the second isolation cell, apply voltage of 0.4V to 0.8V to the connection terminal of the second isolation cell, apply voltage of 0.4V to 0.8V to the first bit line, apply voltage of 0V to the second bit line, apply voltage of 2V to 5V to the word line structure of the memory cell, apply voltage of 2.5V to 5V to the first control gate structure of the memory cell, and apply voltage of 0V to the second control gate structure of the memory cell.

* * * * *